United States Patent
Lu et al.

(10) Patent No.: US 10,224,358 B2
(45) Date of Patent: Mar. 5, 2019

(54) LIGHT EMITTING DEVICE WITH REFLECTIVE SIDEWALL

(71) Applicant: LUMILEDS LLC, San Jose, CA (US)

(72) Inventors: Dawei Lu, San Jose, CA (US); Oleg Shchekin, San Francisco, CA (US)

( * ) Notice: Subject to any disclaimer, the term of this patent is extended or adjusted under 35 U.S.C. 154(b) by 0 days.

(21) Appl. No.: 15/590,802

(22) Filed: May 9, 2017

(65) Prior Publication Data

US 2018/0331144 A1 Nov. 15, 2018

(51) Int. Cl.
| | |
|---|---|
| H01L 27/146 | (2006.01) |
| F21V 7/00 | (2006.01) |
| F21V 7/04 | (2006.01) |
| F21V 7/22 | (2018.01) |
| H05B 33/22 | (2006.01) |
| F21Y 115/10 | (2016.01) |
| C03C 3/12 | (2006.01) |

(52) U.S. Cl.
CPC ...... *H01L 27/14629* (2013.01); *F21V 7/0025* (2013.01); *F21V 7/04* (2013.01); *F21V 7/22* (2013.01); *H05B 33/22* (2013.01); *C03C 3/127* (2013.01); *F21Y 2115/10* (2016.08)

(58) Field of Classification Search
CPC . H01L 27/14629; H01L 33/10; H01L 33/405; H01L 33/46; H01L 33/60; C03C 3/127
See application file for complete search history.

(56) References Cited

U.S. PATENT DOCUMENTS

| | | | |
|---|---|---|---|
| 6,819,309 B1 * | 11/2004 | Kishi | G02F 1/1333 345/107 |
| 7,791,093 B2 * | 9/2010 | Basin | H01L 33/56 257/98 |
| 8,097,894 B2 | 1/2012 | Bierhuizen et al. | |
| 8,853,934 B2 * | 10/2014 | Oyamada | H01L 33/505 313/501 |
| 8,957,428 B2 | 2/2015 | Jagt et al. | |
| 9,070,851 B2 * | 6/2015 | Seo | H01L 27/153 |
| 9,099,626 B2 * | 8/2015 | Ockenfuss | H01L 33/60 |
| 9,164,354 B2 | 10/2015 | Ahlstedt et al. | |
| 9,698,324 B2 * | 7/2017 | Abe | H01L 33/60 |
| 2006/0091779 A1 * | 5/2006 | Takeda | H01L 33/504 313/487 |
| 2008/0117500 A1 * | 5/2008 | Narendran | H01L 33/507 359/326 |

(Continued)

FOREIGN PATENT DOCUMENTS

| | | |
|---|---|---|
| EP | 3142158 A1 | 3/2017 |
| JP | 2010-157638 A | 7/2010 |

*Primary Examiner* — Earl Taylor
(74) *Attorney, Agent, or Firm* — Volpe and Koenig, P.C.

(57) ABSTRACT

Embodiments of the invention include a semiconductor light emitting device including a semiconductor structure. The semiconductor structure includes a light emitting layer disposed between an n-type region and a p-type region. A wavelength converting structure is disposed in a path of light emitted by the light emitting layer. A diffuse reflector is disposed along a sidewall of the semiconductor light emitting device and the wavelength converting structure. The diffuse reflector includes a pigment. A reflective layer is disposed between the diffuse reflector and the semiconductor structure. The reflective layer is a different material from the diffuse reflector.

13 Claims, 3 Drawing Sheets

(56) References Cited

U.S. PATENT DOCUMENTS

| | | | |
|---|---|---|---|
| 2009/0057699 A1* | 3/2009 | Basin | H01L 33/56 257/98 |
| 2010/0117111 A1 | 5/2010 | Illek et al. | |
| 2011/0012147 A1* | 1/2011 | Bierhuizen | G03B 15/05 257/98 |
| 2012/0001204 A1* | 1/2012 | Jagt | H01L 33/504 257/88 |
| 2012/0261700 A1* | 10/2012 | Ooyabu | H01L 33/46 257/98 |
| 2012/0262054 A1* | 10/2012 | Ooyabu | H01L 33/56 313/498 |
| 2013/0015483 A1* | 1/2013 | Shimokawa | H01L 24/96 257/98 |
| 2013/0285084 A1 | 10/2013 | Schneider et al. | |
| 2016/0095184 A1* | 3/2016 | Nakabayashi | H05B 33/22 313/503 |
| 2016/0118558 A1* | 4/2016 | Abe | H01L 33/60 257/98 |
| 2016/0190400 A1* | 6/2016 | Jung | H01L 33/486 362/97.1 |
| 2016/0322548 A1* | 11/2016 | Abe | H01L 33/60 |
| 2016/0329461 A1* | 11/2016 | Huang | H01L 33/46 |
| 2017/0110635 A1* | 4/2017 | Ito | H01L 33/507 |
| 2017/0200873 A1* | 7/2017 | Nakabayashi | H01L 33/60 |
| 2017/0236866 A1 | 8/2017 | Lee et al. | |
| 2017/0271565 A1* | 9/2017 | Abe | H01L 33/60 |
| 2017/0288095 A1* | 10/2017 | Cheng | H01L 33/502 |
| 2017/0294419 A1* | 10/2017 | Nakabayashi | H01L 25/0753 |
| 2017/0294561 A1* | 10/2017 | Ikeda | H01L 33/504 |
| 2017/0345867 A1 | 11/2017 | Chaji et al. | |
| 2017/0365743 A1* | 12/2017 | You | H01L 33/486 |
| 2018/0026168 A1* | 1/2018 | Lenef | H01L 33/60 |

* cited by examiner

LIGHT EMITTING DEVICE WITH REFLECTIVE SIDEWALL

BACKGROUND

Light emitting diodes ("LEDs") are solid state devices that emit light at a certain frequency. Frequency modifying elements, such as a phosphor layer, are used to convert at least some light emitted from the solid state light emitter to light at other frequencies to produce light of a different color than what is emitted from the LED. Other color mediating elements may be included in packaging for one or more LEDs to modify light from the LEDs. Improvements in LED color mediation techniques are constantly being made.

DETAILED DESCRIPTION

Embodiments of the invention include an LED including a first reflector formed on a sidewall of the semiconductor structure, and a second reflector formed adjacent the first reflector. The second reflector may be selected for a particular off-state appearance of the second reflector, when viewed from the top of the device.

Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Figure 1:
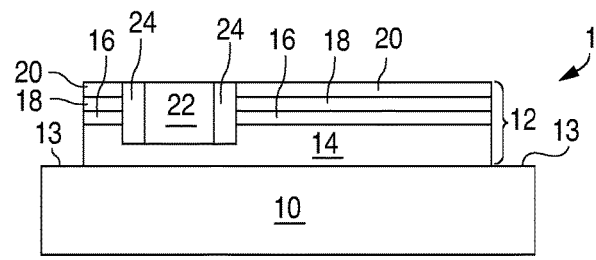
FIG. 1 is a cross sectional view of one example of a III-nitride LED.

FIG. 1 illustrates a semiconductor light emitting device 1 suitable for use in embodiments of the invention. The device illustrated in FIG. 1 is just one example of a device that may be used with embodiments of the invention. Any suitable device may be used with embodiments of the invention—embodiments of the invention are not limited to the details illustrated in FIG. 1. For example, though FIG. 1 illustrates a flip-chip device, embodiments of the invention may be used with other device geometries and are not limited to flip-chip devices.

The device illustrated in FIG. 1 may be formed by first growing a semiconductor structure on a growth substrate 10, as is known in the art. The growth substrate 10 may be any suitable substrate such as, for example, sapphire, SiC, Si, GaN, or composite substrates. An n-type region 14 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 16 is grown over the n-type region. Examples of suitable light emitting regions include a single thick or thin light emitting layer, or a multiple quantum well light emitting region including multiple thin or thick light emitting layers separated by barrier layers. A p-type region 18 is grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 μm in some embodiments and less than 6 μm in some embodiments.

A p-contact metal 20 is formed on the p-type region. The p-contact metal 20 may be reflective and may be a multi-layer stack. For example, the p-contact metal may include a layer for making ohmic contact to the p-type semiconductor material, a reflective metal layer, and a guard metal layer that prevents or reduces migration of the reflective metal. The semiconductor structure is then patterned by standard photolithographic operations and etched to remove a portion of the entire thickness of the p-contact metal, a portion of the entire thickness of the p-type region, and a portion of the entire thickness of the light emitting region, to form at least one mesa which reveals a surface of the n-type region 14 on which a metal n-contact 22 is formed. The n-contact and the p-contact are electrically isolated by a gap 24 which may be filled with a solid, a dielectric, an electrically insulating material, air, ambient gas, or any other suitable material.

Figure 2:
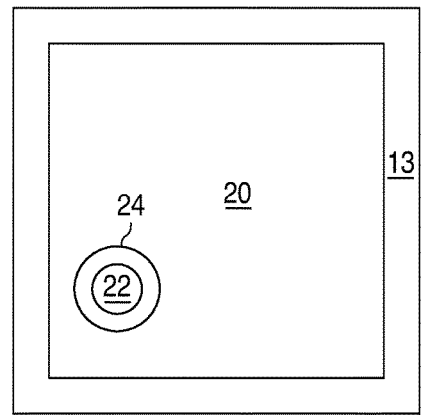
FIG. 2 is a plan view illustrating the arrangement of contacts in the device of FIG. 1.

FIG. 2 is a plan view of the device of FIG. 1, illustrating one example of an arrangement of the p- and n-contacts of FIG. 1. In FIG. 2, the p-contact 20 surrounds the n-contact 22. The n-contact 22 may be round, or any other suitable shape. The p- and n-contacts are electrically isolated by, for example, a dielectric material disposed in a gap 24 between the p- and n-contacts. The p- and n-contacts may be any suitable shape and may be arranged in any suitable way. Patterning a semiconductor structure and forming n- and p-contacts is well known to a person of skill in the art.

Accordingly, the shape and arrangement of the n- and p-contacts is not limited to the embodiment illustrated in FIGS. 1 and 2.

In the regions 13 between individual devices on a wafer of devices, the semiconductor structure may be etched down to an insulating layer, which may be an insulating semiconductor layer that is part of the semiconductor structure, or the growth substrate, as illustrated in FIG. 1. The growth substrate may be removed or may remain part of the device, intact or thinned after growth of the semiconductor structure. The structure illustrated in FIGS. 1 and 2 may be attached to a mount such that a majority of light exiting the device exits through the growth substrate 10, or through the surface of the semiconductor structure exposed by removing the growth substrate, if the growth substrate is removed. Alternatively, thick metal pads which support the semiconductor structure and form electrical contacts to the semiconductor structure may be formed on or attached to the top surface of the device in the orientation illustrated in FIG. 1.

The semiconductor structure and n- and p-contacts are represented in the following figures as block 12.

Figure 3:
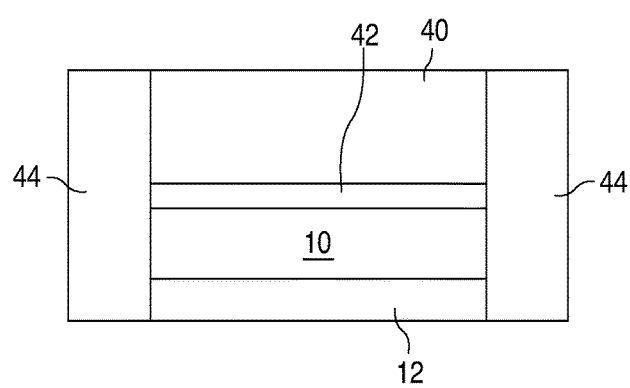
FIG. 3 illustrates a device including an LED, a wavelength converting structure, and a reflective material disposed on the sidewalls of the LED and the wavelength converting structure.

FIG. 3 is a cross sectional view of an LED including a wavelength converting structure 40. Wavelength converting structure 40 is disposed over growth substrate 10 (in embodiments where the growth substrate remains in the device), in the path of light extracted from the LED.

In some embodiments, wavelength converting structure 40 may be, for example, a prefabricated wavelength converting member (i.e. a self-supporting wavelength converting member that is formed separate from the LED) that includes one or more wavelength converting materials that absorb light emitted by the LEDs and emit light of a different wavelength. One example of a suitable wavelength converting structure 40 is a self-supporting wavelength converting ceramic slab. A wavelength converting ceramic may be, for example, a powder phosphor that is sintered into a self-supporting slab. The slab generally contains no binder material other than the phosphor itself. Suitable slabs may be, for example, at least 50 µm thick in some embodiments, no more than 500 µm thick in some embodiments, at least 100 µm thick in some embodiments, and no more than 300 µm thick in some embodiments. Another example of a suitable wavelength converting structure 40 is a powder wavelength converting material disposed in a transparent material to form a self-supporting structure. Examples of suitable transparent materials include silicone, glass, and epoxy. A prefabricated wavelength converting structure 40 may be connected to the LED by an adhesive layer 42, which may be, for example, silicone or any other suitable material.

In some embodiments, wavelength converting structure 40 is not a separately formed structure, but is formed over the LED. For example, wavelength converting structure may be a wavelength converting material such as phosphor that is disposed in a transparent material and laminated, stenciled, dispensed, or otherwise disposed over the LED.

Adhesive layer 42 may be omitted in some embodiments.

The wavelength converting material(s) in the wavelength converting structure 40 may be conventional phosphors, powder phosphors, organic phosphors, quantum dots, organic semiconductors, II-VI or III-V semiconductors, II-VI or III-V semiconductor quantum dots or nanocrystals, dyes, polymers, or materials that luminesce. Any suitable powder phosphor may be used, including but not limited to garnet-based phosphors such as $(Y,Gd,La,Lu,T,Pr,Sm)_3(Al,Ga,In)_5O_{12}$:Ce, $(Lu_{1-x-y-a-b}YxGdy)_3(Al_{1-z}Gaz)_5O_{12}$:$Ce_aPr_b$ wherein 0<x<1, 0<y<1, 0<z≤0.1, 0<a≤0.2 and 0<b≤0.1, $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as $(Ca,Sr)AlSiN_3$:Eu and $(Ca,Sr,Ba)_2Si_5N_8$:Eu.

A wavelength converting structure 40 may be formed such that all or only a portion of the light emitted by the light emitting device and incident on the wavelength converting material may be converted by the wavelength converting material. Unconverted light emitted by the light emitting device may be part of the final spectrum of light, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device.

Wavelength converting structure 40 may include a single wavelength converting material, a mixture of wavelength converting materials, or multiple wavelength converting materials formed as separate layers rather than mixed together. Wavelength converting materials emitting different colors of light may be disposed in separate regions of wavelength converting structure 40 or mixed together.

To prevent light from exiting from the side of the device, a reflective material 44 may be disposed along the sides of the device, such that the reflective material 44 is disposed along sidewalls of the LED and the wavelength converting structure 40. Reflective material is often a diffuse reflector, such as particles which may be reflective and/or which may cause a contrast in index of refraction, mixed with a transparent material. One example is $TiO_2$ particles disposed in silicone. Reflective material 44 may be molded, dispensed, pressed, or formed by any other suitable technique. In some embodiments, after forming reflective material 44, an additional processing step such as bead blasting may remove any excess reflective material.

Though for economy of language, structure 44 in FIG. 3 and similar structures (i.e., a thick, diffusely reflective side coat 52 in FIG. 5, 56 in FIG. 6, 60 in FIG. 7, and 80 in FIGS. 8 and 9) in other figures are referred to herein as reflective or reflectors, in some embodiments, due to the presence of the thin reflective layer described below, the amount of light reaching reflective material 44 is not significant. In such embodiments, a structure 44 is still included in the device, where it functions as a light blocking layer, to prevent the source size from increasing by light that reaches reflective material 44. In such embodiments, structure 44 may be poorly reflecting, at least partially absorbing of light, or totally absorbing of light. In such embodiments, structure 44 need not be reflective.

Figure 4:
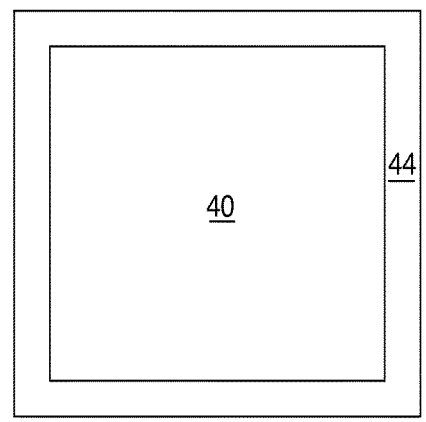
FIG. 4 is a top view of the device illustrated in FIG. 3.

FIG. 4 is a top view of the device illustrated in FIG. 3. The reflective material 44 surrounds the wavelength converting structure 40. When the device illustrated in FIG. 4 is off, the wavelength converting structure 40 may absorb some ambient light and emit wavelength converted light in response. For example, a yttrium aluminum garnet (YAG) wavelength converting structure may appear yellowish in the off state. Since the surrounding reflective material 44 may have a significant width compared to the wavelength converting structure, the surrounding reflective material 44 is visible when the LED is off. The surrounding reflective material 44 may appear whitish in the off state. The different off-state colors of the wavelength converting structure 40 and the reflective material 44 may be unappealing.

One solution to the different off-state colors of the reflective material 44 and the wavelength converting structure 40 is to add pigment to the reflective material 44 to change the off-state appearance to match the off-state color of the wavelength converting structure 40. One disadvantage of adding pigment to change the color of the reflective material is the addition of pigment can cause a significant drop in optical efficiency of the device.

Figure 5:
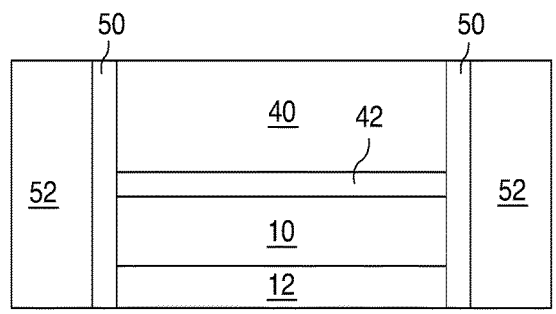
FIGS. 5, 6, and 7 are cross sectional views of devices including a thin reflective layer disposed between a diffuse reflective sidewall and an LED and/or wavelength converting structure.
Figure 6:
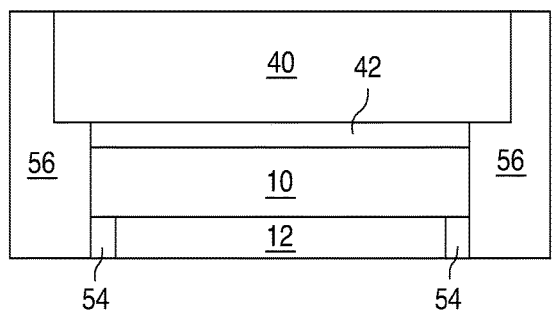
Figure 7:
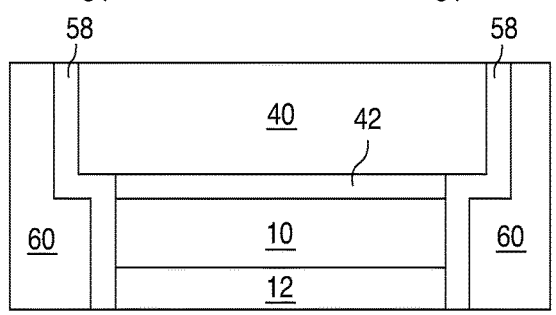

In embodiments of the invention, in a device with a diffuse reflector or light blocking structure disposed on a sidewall of the LED and/or wavelength converting structure, a thin reflective layer is disposed between the diffuse reflector and at least a portion of the sidewall. FIGS. 5, 6, and 7 illustrate devices including a thin reflective layer disposed along a sidewall of the device. The top surface of the diffuse reflector is at substantially the same elevation as the top surface of the wavelength converting structure in the devices of FIGS. 5, 6, and 7.

The thin reflective layer in FIGS. 5, 6, and 7 is disposed between the diffuse reflective sidewall and either or both of the wavelength converting structure and the LED. The thin reflective layer may be a different material from the diffuse reflective sidewall. In some embodiments, the diffuse reflective sidewall includes a pigment to alter the color of the diffuse reflective sidewall, for example to more closely match the off-state color of the wavelength converting structure disposed over the LED. In some embodiments, the diffuse reflective sidewall is non-white. The diffuse reflective sidewall may be reflective material 44, as described above in the text accompanying FIGS. 3 and 4. In one example, the diffuse reflective sidewall is particles such as $TiO_2$ disposed in a transparent material such as silicone. Pigment may be mixed with the transparent material and particles, or formed after the diffuse reflective sidewall, for example by painting on the surface of the diffuse reflective sidewall.

In various embodiments, the thin reflective layer is a single thin layer, or a stack of multiple thin-film layers that may be of the same or different thicknesses and may contain the same or different materials. In various embodiments, the thin reflective layer is a single layer of insulating material, such as a layer of an oxide, an oxide of silicon, or a nitride of silicon, multiple layers of insulating material, one or more metal layers electrically isolated from the LED by an insulating layer, a distributed Bragg reflector, such as an alternating stack of insulating layers having different indices of refraction, an alternating stack of $SiO_2/TiO_2$ layers, an alternating stack of $Al_2O_3/TiO_2$ layers, or an alternating stack of $SiO_2/Nb_2O_5$ layers. In general, the thin reflective layer may include at least two layers in some embodiments, no more than 80 layers in some other embodiments, at least 20 layers in some embodiments, no more than 50 layers in some embodiments, and about 40 layers in some embodiments. Each thin-film layer in the thin reflective layer may be at least 100 nm thick in some embodiments, no more than 10 microns thick in some embodiments, at least 500 nm thick in some embodiments, and no more than 2 microns thick in some embodiments. The total thickness of the thin reflective layer may be at least 1 micron in some embodiments, no more than 50 microns in some embodiments, at least 5 microns in some embodiments, and no more than 25 microns in some embodiments. In some embodiments, the thin reflective layer may provide a reflectivity up to about 99% for light having some or all of the wavelengths emitted by the active region of the LED and/or the wavelength converting structure.

Examples of some suitable materials used to form the thin reflective layer include: metals such as silver (Ag), gold (Au), aluminum (Al), nickel (Ni), platinum (Pt), and palladium (Pd); metal-oxides such as $TiO_2$, $Al_2O_3$, $Nb_2O_5$, $HfO_2$, and ZrO, metal-nitrides such as $TiN_x$ and AlN, other dielectric materials such as $SiO_2$ or $SiN_x$; insulting layers; and combinations thereof. In some embodiments, the thin reflective layer is or includes a distributed Bragg reflector. In some embodiments, the thin reflective layer includes a stack of layers that alternate high index of refraction layers and low index of refraction layers. In some embodiments, the thin reflective layer is a multi-layer stack including repeating groups of two, three, or more layers. In some embodiments, the thin reflective layer includes dielectric layers combined with metal layers.

In some embodiments, the thin reflective layer may include one or more layers of a porous material, such as a porous metal-oxide material or a porous glass. Such material may be made porous, i.e., containing gas or air pockets, in order to manipulate the index of refraction of the material. The index of refraction of a porous material is typically less than the index of refraction of the bulk material. Porous materials may be formed by, for example, any suitable process including a gel process or a pulsed laser deposit. In some embodiments, the porosity (and therefore, the index of refraction) of a layer in the thin reflective layer may be graded.

In some embodiments, the thin reflective layers described above may be formed on surfaces of the LED die and/or on surfaces of other structures (such as wavelength converting structures, mounts, supports, etc.) by thin-film deposition methods such as, for example, sputtering deposition, atomic layer deposition (ALD), and vacuum evaporation or by liquid-solid phase techniques, such as, for example, a sol-gel method.

In the device of FIG. 5, the thin reflective layer 50 is disposed on the sidewalls of the LED, including substrate 10 and semiconductor/contact structure 12, the adhesive 42 if present, and the wavelength converting structure 40. The wavelength converting structure 40 is substantially the same width as the LED. The thin reflective layer 50 is disposed between the diffuse reflective sidewall 52 and the LED and wavelength converting structure.

In the device of FIG. 6, the thin reflective layer 54 is disposed only on the sidewalls of the semiconductor and contact structure 12 of the LED. The thin reflective layer 54 is not disposed on the sidewalls of the wavelength converting structure 40, the adhesive 42, and the substrate 10. The thin reflective layer 54 is disposed between the diffuse reflective sidewall 56 and the semiconductor and contact structure 12. The sidewalls of the substrate 10, wavelength converting structure 40, and adhesive 42 are in direct contact with the diffuse reflective sidewall 56. As an alternative to the arrangement illustrated in FIG. 6, the thin reflective layer 54 may be disposed along the sidewalls of only the wavelength converting structure 40, only the adhesive 42, only the substrate 10, or along the sidewalls of any combination of the wavelength converting structure 40, the adhesive 42, the semiconductor and contact structure 12, and the substrate 10.

In the device of FIG. 7, as in the device of FIG. 5, the thin reflective layer 58 is disposed on the sidewalls of the LED, including substrate 10 and semiconductor/contact structure 12, the adhesive 42 if present, and the wavelength converting structure 40. In the devices of FIGS. 6 and 7, the wavelength converting structure 40 is wider than the LED. In the device of FIG. 7, the thin reflective layer 58 is disposed between the diffuse reflective sidewall 60 and the LED and wavelength converting structure.

In the embodiments illustrated in FIGS. 5 and 7, the thin reflective layer is disposed on the sidewalls of both the LED and the wavelength converting structure 40. In some embodiments, the thin reflective layer is configured to reflect both the unconverted light from the LED (often blue), and the converted light from the wavelength converting structure 40 (often including yellow-green, red, etc.) In some embodiments, different thin reflective layers are disposed on the LED and the wavelength converting structure 40. For example, the thin reflective layer disposed on the LED is tuned to reflect unconverted light from the LED, and the thin reflective layer disposed on the wavelength converting structure is tuned to reflect the wavelength converted light. In some embodiments, a single thin reflective layer is disposed on both the LED and the wavelength converting structure, but different portions of the thin reflective layer are tuned to reflect different types of light. For example, the thin reflective layer may have two segments, a first segment including layer pairs configured to reflect unconverted light from the LED, and a second segment including layer pairs configured to reflect wavelength converting light. The first and second segment are stacked on top of each other, such that a first portion of the thickness of the thin reflective layer (for example, half the thickness) is tuned to reflect unconverted light from the LED, and a second portion of the thickness of the thin reflective layer is tuned to reflect wavelength converted light.

Figure 8:
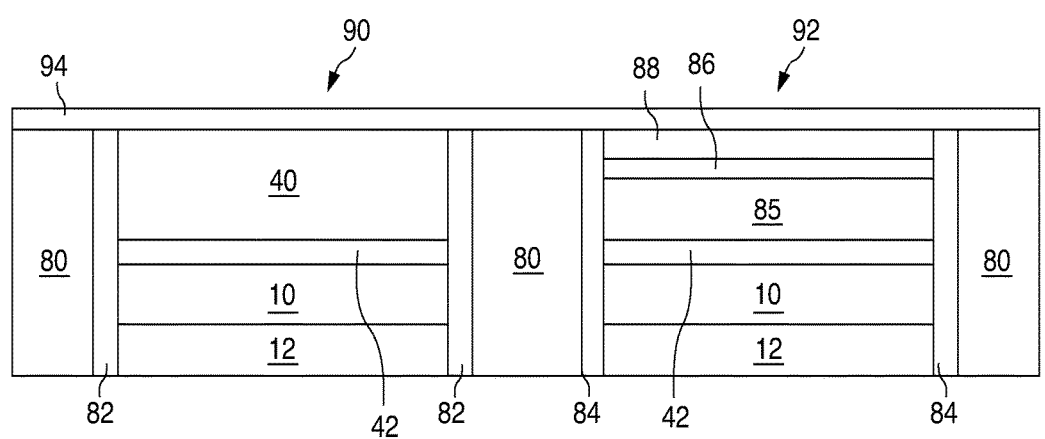
FIG. 8 is a cross sectional view of a device including a cool white emitter, a warm white emitter, and a diffuse reflective sidewall.
Figure 9:
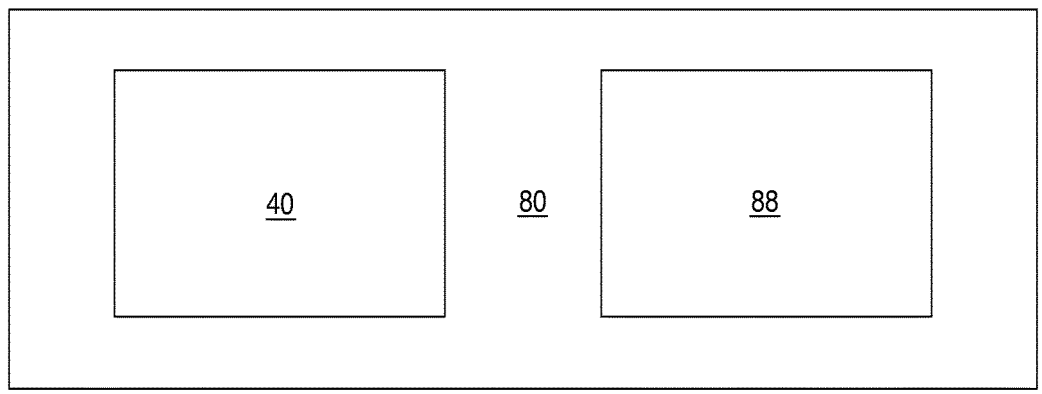
FIG. 9 is a top view of the device of FIG. 8.

FIG. 8 is a cross sectional view illustrating a device including two wavelength converted LEDs, a cool white emitter 90 and a warm white emitter 92. A diffuse reflector 80 surrounds each emitter 90, 92, and is disposed between them, as illustrated in the top view of FIG. 9. The cool white emitter 90 includes a wavelength converting structure 40, as described above. In the off-state the wavelength converting structure 40 may appear yellow. The warm white emitter 92 includes a wavelength converting structure 85 that includes more red-emitting wavelength converting material than the wavelength converting structure 40; therefore, in the off-state, the wavelength converting structure 85 appears orange or orange-red. The difference in off-state appearance between the warm white emitter 92, the cool white emitter 90, and the diffuse reflector 80 is undesirable.

In the device illustrated in FIG. 8, the diffuse reflector includes pigment to match the off-state appearance of wavelength converting structure 40, as described above. Thin reflective layer 82, as described above, is disposed on the sidewalls of the cool white emitter 90, between the LED and wavelength converting structure and the diffuse reflector 80. Thin reflective layer 84, as described above, is disposed on the sidewalls of the warm white emitter 92, between the LED and wavelength converting structure and the diffuse reflector 80.

In order to match the off-state appearance of the warm white emitter 92 to the cool white emitter 90 and the diffuse reflector 80, a wavelength converting layer 88 with the same off-state appearance as the wavelength converting structure 40 is disposed over the warm white wavelength converting structure 85. In the off-state, when ambient light falls on the wavelength converting layer 88, it excites the wavelength converting layer 88 and emits light the same color as wavelength converting structure 40. A thin reflective layer 86, which may be a dichroic filter or any of the suitable thin reflective layers described above, is disposed between the wavelength converting layer 88 and the warm white wavelength converting structure 85, and tuned to reflect short wavelength light, such as blue light. The thin reflective layer reduces the amount of ambient light in the off-state that reaches the warm white wavelength converting structure 85 and can excite the warm white wavelength converting structure 85. Any ambient light within the excitation spectrum of the warm white wavelength converting structure 85 that reaches the wavelength converting structure 85 will cause it to emit light that is redder than the light from wavelength converting layer 88 and wavelength converting structure 40, which would change the off-state appearance of the wavelength converting layer 88. Though the thin reflective layer 86 also reflects unconverted light from the LED, warm white emitters tend to be so heavily wavelength converted that the presence of thin reflective layer 86 does not appreciably affect the performance of the warm white emitter 92.

In some embodiments, an optional scattering layer 94 is formed over the structure illustrated in FIG. 8. The scattering layer 94 may further improve the off-state appearance of the cool white emitter 90 and warm white emitter 92. In various embodiments, the scattering layer 94 is formed over only cool white emitter 90, only warm white emitter 92, one or both emitters but not the diffuse reflector 80, or the entire structure, as illustrated in FIG. 8. Scattering layer 94 may be, for example, particles that cause scattering disposed in a transparent material. Any suitable materials may be used, including, for example, $TiO_2$ and/or alumina particles, and silicone or any other suitable transparent material. Optional scattering layer 94 may be used with any of the examples and embodiments described herein.

Having described the invention in detail, those skilled in the art will appreciate that, given the present disclosure, modifications may be made to the invention without departing from the spirit of the inventive concept described herein. In particular, different features and components of the different devices described herein may be used in any of the other devices, or features and components may be omitted from any of the devices. A characteristic of a structure described in the context of one embodiment, may be applicable to any embodiment. Therefore, it is not intended that the scope of the invention be limited to the specific embodiments illustrated and described.

What is being claimed is:

1. A device comprising:
  a semiconductor light emitting device comprising a semiconductor structure comprising a light emitting layer disposed between an n-type region and a p-type region;
  a wavelength converting structure disposed over the light emitting layer;
  a light blocking structure disposed along a sidewall of the semiconductor light emitting device and the wavelength converting structure, the light blocking structure comprising a pigment; and
  a reflective layer disposed between the light blocking structure and the semiconductor structure, the reflective layer including alternating first and second insulating layers, the first insulating layers having a different index of refraction from the second insulating layers.

2. The device of claim 1 wherein the light blocking structure comprises particles disposed in a transparent material.

3. The device of claim 1 wherein a first surface of the light blocking structure is at the same elevation as a first surface of the wavelength converting structure.

4. The device of claim 1 wherein the reflective layer comprises an oxide and the light blocking structure comprises silicone.

5. A device comprising:
a semiconductor light emitting device comprising a semiconductor structure comprising a light emitting layer disposed between an n-type region and a p-type region;
a wavelength converting structure disposed over the light emitting layer;
a light blocking structure disposed along a sidewall of the semiconductor light emitting device and the wavelength converting structure, the light blocking structure comprising a pigment, and the light blocking structure being the same color as an off-state color of the wavelength converting structure; and
a reflective layer disposed between the light blocking structure and the semiconductor structure, the reflective layer including a different material from the light blocking structure.

6. The device of claim 1 wherein the light blocking structure is non-white.

7. A device comprising:
a semiconductor light emitting diode comprising a semiconductor structure comprising a light emitting layer disposed between an n-type region and a p-type region;
a wavelength converting structure disposed over the light emitting layer;
a diffuse reflector disposed along a sidewall of the semiconductor light emitting device and the wavelength converting structure, the diffuse reflector comprising particles disposed in a transparent material; and
a reflective layer disposed between the diffuse reflector and the semiconductor structure, wherein the reflective layer comprises an oxide layer.

8. The device of claim 7 wherein the particles are TiO$_2$ and the transparent material is silicone.

9. The device of claim 7 wherein the reflective layer comprises alternating first and second insulating layers, wherein the first insulating layers have a different index of refraction from the second insulating layers.

10. A device comprising:
a semiconductor light emitting diode comprising a semiconductor structure comprising a light emitting layer disposed between an n-type region and a p-type region;
a wavelength converting structure disposed over the light emitting layer;
a diffuse reflector disposed along a sidewall of the semiconductor light emitting device and the wavelength converting structure, the diffuse reflector comprising particles disposed in a transparent material, the diffuse reflector having the same color as an off-state color of the wavelength converting structure; and
a reflective layer disposed between the diffuse reflector and the semiconductor structure, wherein the reflective layer comprises an oxide layer.

11. The device of claim 7 wherein the diffuse reflector is non-white.

12. A device comprising:
a first semiconductor light emitting diode comprising a semiconductor structure comprising a light emitting layer disposed between an n-type region and a p-type region;
a first wavelength converting structure disposed over the first light emitting diode;
a second semiconductor light emitting diode comprising a semiconductor structure comprising a light emitting layer disposed between an n-type region and a p-type region;
a second wavelength converting structure disposed over the second light emitting diode;
a third wavelength converting structure, wherein the second wavelength converting structure is disposed between the third wavelength converting structure and the second semiconductor light emitting diode;
a thin reflective layer disposed between the second and third wavelength converting structures; and
a light blocking layer disposed between the first and second wavelength converting structures; wherein:
an off-state appearance of the first and third wavelength converting structures and the light blocking layer is the same color; and
an off-state appearance of the second wavelength converting structure is a different color from the off-state appearance of the first and third wavelength converting structures.

13. The device of claim 12 wherein the thin reflective layer is a first thin reflective layer, the device further comprising:
a second thin reflective layer disposed between the first semiconductor light emitting diode and the light blocking structure; and
a third thin reflective layer disposed between the second semiconductor light emitting diode and the light blocking structure.

* * * * *